United States Patent
Yokoyama et al.

(10) Patent No.: US 9,190,460 B2
(45) Date of Patent: *Nov. 17, 2015

(54) ORGANIC LIGHT EMITTING DEVICE AND DISPLAY UNIT INCLUDING THE SAME

(71) Applicant: Sony Corporation, Tokyo (JP)

(72) Inventors: Seiichi Yokoyama, Kanagawa (JP); Atsuya Makita, Kanagawa (JP); Eiji Hasegawa, Kanagawa (JP); Jiro Yamada, Kanagawa (JP); Hirohisa Shirai, Nagasaki (JP); Yasutaka Koga, Nagasaki (JP); Shinsuke Hibarino, Nagasaki (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/546,414

(22) Filed: Nov. 18, 2014

(65) Prior Publication Data

US 2015/0069375 A1  Mar. 12, 2015

Related U.S. Application Data

(63) Continuation of application No. 13/413,054, filed on Mar. 6, 2012.

(30) Foreign Application Priority Data

Mar. 30, 2011 (JP) ................................ 2011-075724
Dec. 22, 2011 (JP) ................................ 2011-281214

(51) Int. Cl.
  *H01L 29/08* (2006.01)
  *H01L 27/32* (2006.01)
  *H01L 51/52* (2006.01)

(52) U.S. Cl.
  CPC ........ *H01L 27/3248* (2013.01); *H01L 27/3246* (2013.01); *H01L 27/3272* (2013.01); *H01L 51/5218* (2013.01); *H01L 51/5253* (2013.01); *H01L 2251/5315* (2013.01)

(58) Field of Classification Search
  CPC ............ H01L 27/3246; H01L 27/3248; H01L 27/3272; H01L 2251/5315; H01L 51/5218; H01L 51/5253
  See application file for complete search history.

(56) References Cited

U.S. PATENT DOCUMENTS 8,963,170 B2 * 2/2015 Yokoyama et al. ............. 257/88
2008/0122035 A1 5/2008 Watanabe (Continued)

FOREIGN PATENT DOCUMENTS

JP 2001-110575 4/2001
JP 2001-175200 6/2001

(Continued)

OTHER PUBLICATIONS

Chinese Office Action issued Jun. 3, 2015 for corresponding Chinese Application No. 201210080412.1.

(Continued)

*Primary Examiner* — Whitney T Moore
*Assistant Examiner* — Joseph Galvin, III
(74) *Attorney, Agent, or Firm* — Michael Best & Friedrich LLP

(57) ABSTRACT

An organic light emitting device includes a first electrode and a second electrode, an organic layer including a light emitting layer between the first electrode and the second electrode, and an insulating film covering a rim of the first electrode from a surface thereof to a side surface thereof, and having an internal wall surface being in contact with the organic layer, and one or more corner sections in the internal wall surface with a ridge line thereof in parallel with the surface of the first electrode.

4 Claims, 13 Drawing Sheets

(56) References Cited

U.S. PATENT DOCUMENTS

2009/0284144 A1* 11/2009 Fujioka et al. ............... 313/504
2010/0176720 A1    7/2010 Yamazaki

FOREIGN PATENT DOCUMENTS

| | | |
|---|---|---|
| JP | 2004-145244 A | 5/2004 |
| JP | 2004-198486 A | 7/2004 |
| JP | 2009-004347 | 1/2009 |
| JP | 2009-123714 A | 6/2009 |
| JP | 2010-010670 A | 1/2010 |
| JP | 2010-282807 A | 12/2010 |
| WO | WO-2009/147838 A1 | 12/2009 |

OTHER PUBLICATIONS

Japanese Office Action issued Aug. 18, 2015 for corresponding Japanese Application No. 2011-281214.

* cited by examiner

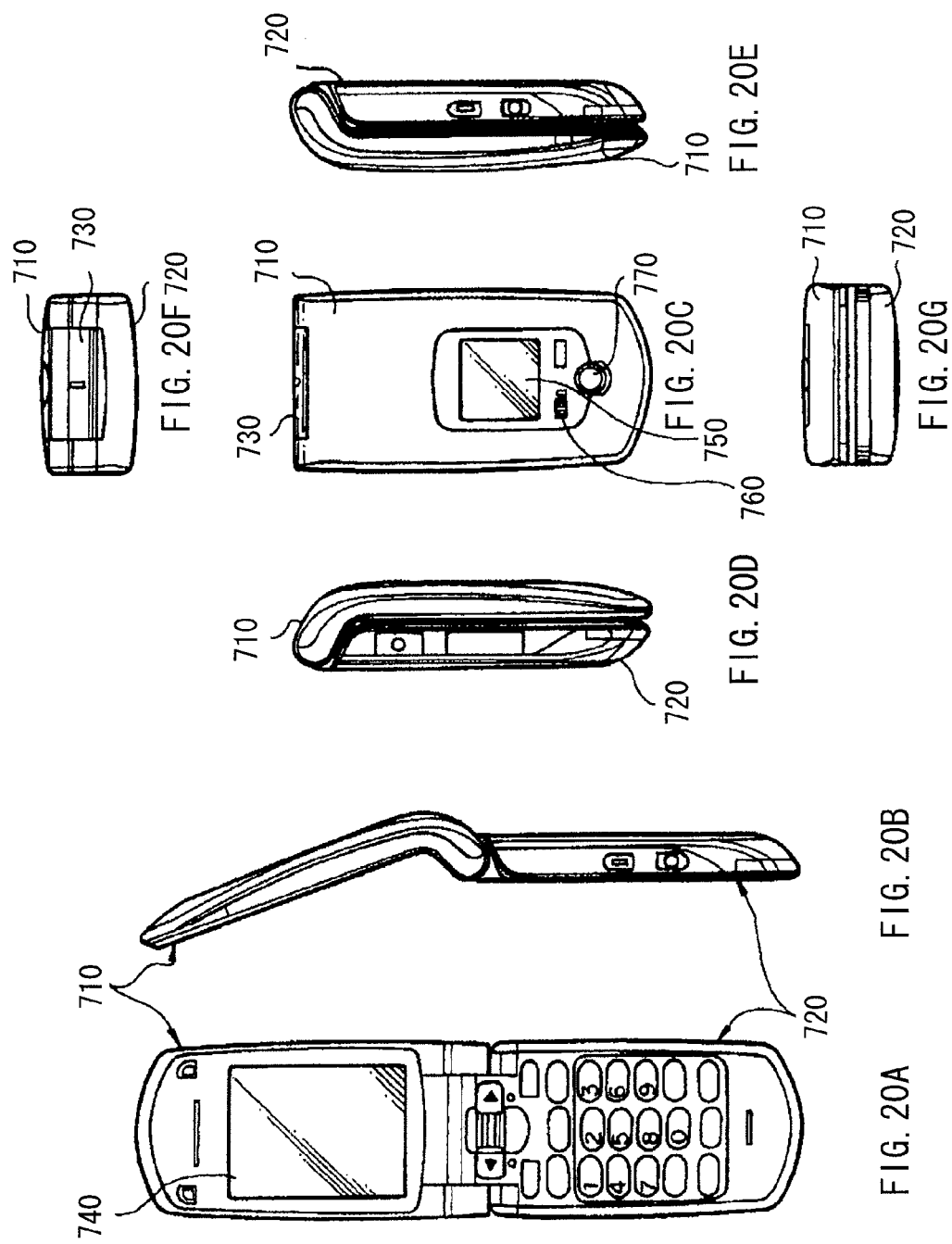

ORGANIC LIGHT EMITTING DEVICE AND DISPLAY UNIT INCLUDING THE SAME

CROSS REFERENCES TO RELATED APPLICATIONS

This is a Continuation Application of U.S. patent application Ser. No. 13/413,054, filed Mar. 6, 2012, which in turn claims priority from Japanese Application Nos.: 2011-075724 and 2011-281214, Mar. 30, 2011 and Dec. 22, 2011, respectively, the entire contents of which are incorporated herein by reference.

BACKGROUND

The present technology relates to an organic light emitting device having an insulating film as a device separation film under an organic layer and a display unit including the same.

In recent years, as one of flat panel displays, an organic light emitting display using an organic light emitting device have attracted attentions. Since the organic light emitting display does not need a backlight, the thickness and the weight thereof are able to be decreased. Further, since the organic light emitting display is a self-luminous type display, the view angle is wide and the power consumption is low. Further, the organic light emitting display is regarded as a display having sufficient response to a high-definition and high-speed video signal. Therefore, development of the organic light emitting display has been advanced toward the practical use thereof.

As a configuration of the organic light emitting device, for example, a configuration in which a first electrode, an organic layer including a light emitting layer, and a second electrode are sequentially formed over a substrate with a TFT (Thin Film Transistor), a planarizing layer, and the like in between has been known (for example, Japanese Unexamined Patent Application Publication No. 2001-110575). On the rim of the first electrode, an insulating film (device separation film) to secure insulation between the first electrode and the second electrode is provided (for example, Japanese Unexamined Patent Application Publication Nos. 2009-4347 and 2001-175200). The insulating film is provided in the moderately tapered shape for the purpose of preventing deterioration of device characteristics due to disconnection of the organic layer having a significantly small film thickness and the second electrode.

SUMMARY

However, in the case where the foregoing moderately tapered-shaped insulating film is used, the first electrode is widely covered with the insulating film, leading to a disadvantage of a lowered aperture ratio. In particular, in the case where such an insulating film is applied to a small and high-definition display unit, such a disadvantage has a major impact.

It is desirable to provide an organic light emitting device capable of preventing disconnection of the organic layer and the second electrode and having a high aperture ratio and a display unit including the organic light emitting device.

According to an embodiment of the present technology, there is provided a first organic light emitting device including a first electrode and a second electrode, an organic layer including a light emitting layer between the first electrode and the second electrode, and an insulating film covering a rim of the first electrode from a surface thereof to a side surface thereof, and having an internal wall surface being in contact with the organic layer, and one or more corner sections in the internal wall surface with a ridge line thereof in parallel with the surface of the first electrode.

According to an embodiment of the present technology, there is provided a second organic light emitting device including a first electrode and a second electrode, an organic layer including a light emitting layer between the first electrode and the second electrode, and an insulating film covering a side surface of the first electrode, and having an inclined surface from an upper end to a lower end of the side surface.

According to an embodiment of the present technology, there is provided a first display unit including a plurality of organic light emitting devices, in which the organic light emitting devices include a first electrode and a second electrode, an organic layer including a light emitting layer between the first electrode and the second electrode, and an insulating film covering a rim of the first electrode from a surface thereof to a side surface thereof, and having an internal wall surface being in contact with the organic layer, and one or more corner sections in the internal wall surface with a ridge line thereof in parallel with the surface of the first electrode.

According to an embodiment of the present technology, there is provided a second display unit including a plurality of organic light emitting devices, in which the organic light emitting devices include a first electrode and a second electrode, an organic layer including a light emitting layer between the first electrode and the second electrode, and an insulating film covering a side surface of the first electrode, and having an inclined surface from an upper end to a lower end of the side surface.

In the first organic light emitting device or the first display unit according to the embodiment of the technology, the internal wall surface of the insulating film (device separation film) being in contact with the organic layer has a plurality of faces each having different inclined angle with respect to the surface (horizontal surface) of the first electrode bounded by the corner section, that is, a relatively precipitous face on the first electrode side (first face) and one or more faces on the second electrode side with a relatively moderate inclined angle (second face). While the second face suppresses disconnection of the second electrode, the first face secures the aperture size.

In the second organic light emitting device or the second display unit according to the embodiment of the technology, the portion from the upper end to the lower end of the side surface of the first electrode is covered with the insulating film. Therefore, the insulating film is not formed on the surface of the first electrode, the entire surface of the first electrode is exposed, and disconnection of the second electrode is suppressed by the inclined surface of the insulating film.

In the first organic light emitting device and the first display unit according to the embodiment of the technology, one or more corner sections are provided in the internal wall surface of the insulating film as the device separation film. In the second organic light emitting device and the second display unit according to the embodiment of the technology, the inclined surface is provided in the insulating film as the device separation film. Therefore, deterioration of device characteristics due to disconnection of the organic layer and the second electrode is able to be prevented, and the aperture ratio is able to be improved.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the present disclosure, and are incorporated in and constitute a part of this specification. The drawings illustrate embodiments and, together with the specification, serve to explain the principles of the technology.

FIG. 20A is an elevation view of a fifth application example unclosed, FIG. 20B is a side view thereof, FIG. 20C is an elevation view of the fifth application example closed, FIG. 20D is a left side view thereof, FIG. 20E is a right side view thereof, FIG. 20F is a top view thereof, and FIG. 20G is a bottom view thereof.

DETAILED DESCRIPTION

Figure 1:
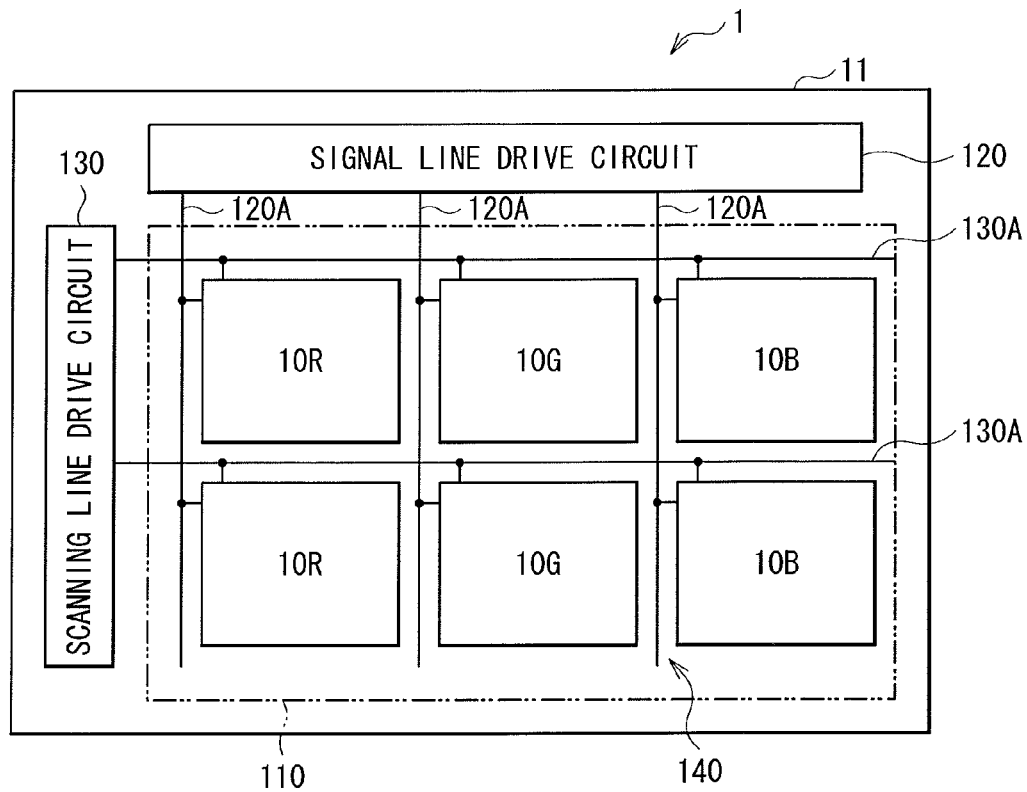
FIG. 1 is a diagram illustrating a configuration of a display unit according to a first embodiment of the present disclosure.

Embodiments of the present technology will be hereinafter described in detail with reference to the drawings. The description will be given in the following order:
1. First embodiment (example that an insulating film has a corner section)
2. Modification (example that an insulating film has a plurality of corner sections)
3. Second embodiment (example that an insulating film has an inclined surface)
4. Application examples First Embodiment FIG. 1 illustrates a configuration of a display unit (display unit 1) according to an embodiment of the present disclosure. The display unit 1 is an organic EL (Electroluminescence) display unit. In the display unit 1, as a display region 110, a plurality of organic EL devices (organic light emitting devices) 10R, 10G, and 10B are arranged in a matrix state over a substrate 11. The organic EL devices 10R, 10G, and 10B respectively generate red light (wavelength: from 620 nm to 750 nm both inclusive), green light (wavelength: from 495 nm to 570 nm both inclusive), and blue light (wavelength: from 450 nm to 495 nm both inclusive). A signal line drive circuit 120 and a scanning line drive circuit 130 to display an image are provided on the periphery of the display region 110.

Figure 2:
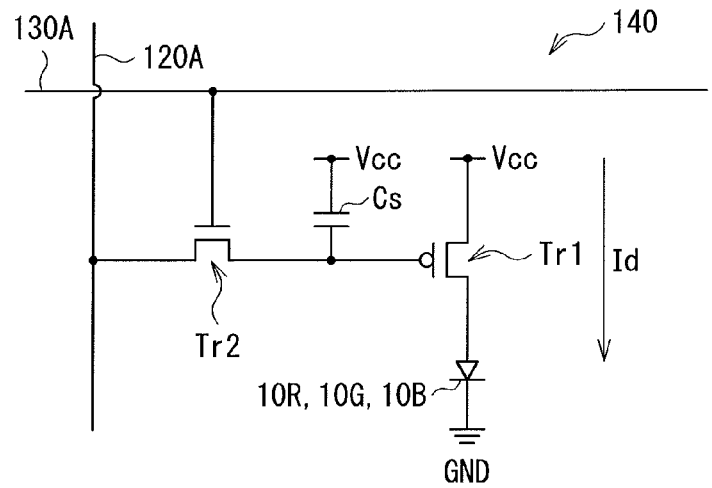
FIG. 2 is a diagram illustrating an example of the pixel drive circuit illustrated in FIG. 1.

In the display region 110, an active type drive circuit (pixel drive circuit 140) is provided. As illustrated in FIG. 2, the pixel drive circuit 140 has a drive transistor Tr1 and a writing transistor Tr2, and a capacitor Cs is provided in a region between transistors Tr1 and Tr2. The organic EL device 10R (or the organic EL device 10G or 10B) is serially connected to the transistor Tr1 between a first power line (Vcc) and a second power line (GND). The signal line drive circuit 120 supplies an image signal to a source electrode of the transistor Tr2 through a plurality of signal lines 120A arranged in the column direction. The scanning line drive circuit 130 supplies a scanning signal sequentially to a gate electrode of the transistor Tr2 through a plurality of scanning lines 130A arranged in the row direction.

Figure 3:
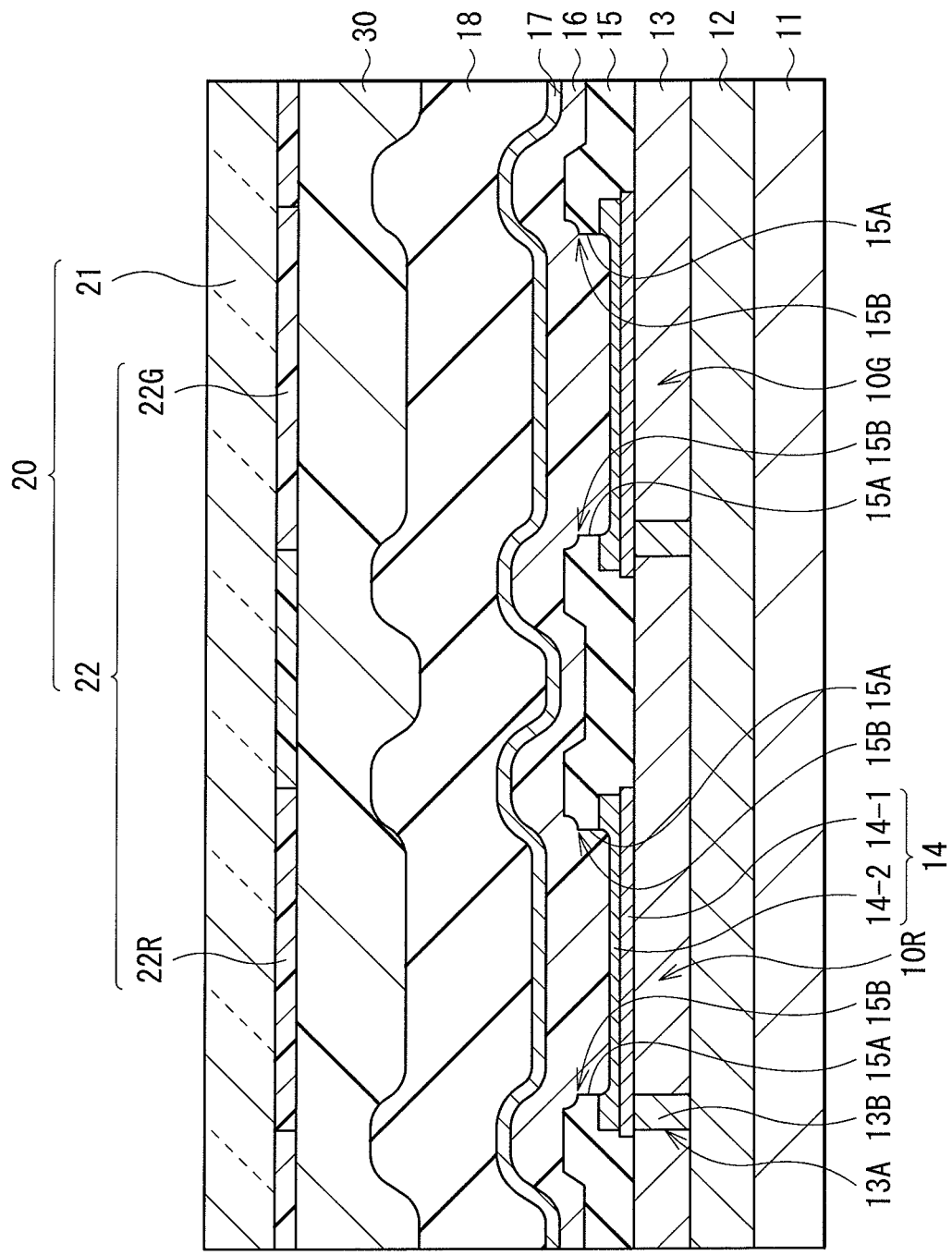
FIG. 3 is a cross-sectional view illustrating a configuration of the organic EL device illustrated in FIG. 1.

FIG. 3 illustrates a cross-sectional configuration of the organic EL devices 10R and 10G illustrated in FIG. 1. Though FIG. 3 does not illustrate the organic EL device 10B, the organic EL device 10B has a configuration approximately identical with that of the organic EL devices 10R and 10G. The organic EL devices 10R and 10G respectively have a configuration in which a drive circuit layer 12 including the foregoing pixel drive circuit 140, a planarizing layer 13, a first electrode 14 as an anode, an insulating film 15, an organic layer 16 including a light emitting layer 16C described later, and a second electrode 17 as a cathode are layered in this order from the substrate 11 side. Light generated in the light emitting layer 16C is extracted from the second electrode 17 side.

The organic EL devices 10R, 10G, and 10B as above are covered with a protective film 18. Further, a sealing panel 20 is bonded to the whole surface of the protective film 18 with an adhesive layer 30 in between, and thereby the organic EL devices 10R, 10G, and 10B are sealed.

The substrate 11 is made of glass, a silicon (Si) wafer, a resin, a conductive substrate, or the like. In the case where the conductive substrate is used, the surface thereof is insulated with the use of silicon dioxide ($SiO_2$) or a resin. Configuration of the drive circuit layer 12 is not particularly limited. For example, a TFT of the drive circuit layer 12 may be, for example, bottom gate type or top gate type. Further, the TFT of the drive circuit layer 12 may be a MOSFET (Metal Oxide Semiconductor Field Effect Transistor).

The planarizing layer 13 is intended to planarize the surface of the substrate 11 on which the pixel drive circuit 140 is formed. The planarizing layer 13 is preferably made of a material with favorable pattern precision, since the planarizing layer 13 is provided with a fine connection hole 13A. The drive transistor Tr1 of the drive circuit layer 12 is electrically connected to the first electrode 14 through the connection hole 13A provided in the planarizing layer 13. The connection hole 13A is provided with a plug 13B made of a conductive metal. Examples of materials of the planarizing layer 13 include an organic material such as acryl and polyimide and an inorganic material such as silicon oxide ($SiO_2$), silicon nitride (SiNx) and silicon oxynitride (SiON).

The first electrode 14 also has a function as a reflecting layer, and desirably has high reflectance as much as possible in order to improve light emitting efficiency. However, for example, if the first electrode 14 is made of a high-reflectivity metal material such as aluminum (Al), an aluminum alloy, and a silver (Ag) alloy, it is difficult to use a material with a high resistance value for the organic layer 16 (after-mentioned hole injection layer 16A) being in contact with the first electrode 14 in terms of hole injection barrier. That is, a leakage current is easily generated between the organic EL device 10R and the organic EL device 10G adjacent to each other (or between the organic EL device 10G and the organic EL device 10B, and between the organic EL device 10B and the organic EL device 10R). Though a description will be given later for details, in this embodiment, since a leakage current is able to be suppressed from being generated by a corner section 15B provided in an internal wall surface 15A of the insulating film 15, a high-reflectivity material is able to be used for the first electrode 14. A portion exposed from the insulating film 15 of the first electrode 14 as a result of being ground in forming the corner section 15B is thinner by about from 4 nm to 25 nm both inclusive than a portion being layered on the insulating film 15 of the first electrode 14.

Further, since the first electrode 14 is used as an anode, the first electrode 14 is desirably made of a material with high electron hole injectivity. Examples of such a first electrode 14 include an electrode that has a thickness in the lamination direction (hereinafter simply referred to as thickness) of from 30 nm to 1000 nm both inclusive and that is composed of a simple substance or an alloy of metal elements such as chromium (Cr), gold (Au), platinum (Pt), nickel (Ni), copper (Cu), molybdenum (Mo), tungsten (W), titanium (Ti), tantalum (Ta), and silver (Ag). The surface of the first electrode 14 may be provided with a transparent conductive film such as an oxide of indium and tin (ITO). The thickness of the first electrode is adjusted according to balance between a wiring resistance and reflectance (surface roughness).

If the appropriate hole injection layer 16A is provided, a material that has high reflectance but also has hole injection barrier issue due to existence of surface oxide film and small work function such as an aluminum (Al) alloy may be used as a material of the first electrode 14. For example, an aluminum layer being 30 nm thick may be used singly. Otherwise, the first electrode 14 may be composed by layering aluminum being 15 nm thick on titanium, tungsten, copper, tantalum, or molybdenum being 20 nm thick. In this embodiment, the first electrode 14 is composed of two layers that are first electrodes 14-1 and 14-2.

The insulating film 15 is provided to cover the rim of the first electrode 14 from the surface (surface opposed to the second electrode 17) thereof to a side surface (end surface) thereof. The insulating film 15 is intended to secure insulation between the first electrode 14 and the second electrode 17 and insulation between the organic EL devices 10R, 10G, and 10B adjacent to one another, and to obtain a desired shape of the light emitting region accurately.

Though the insulating film 15 is composed of, for example, silicon oxynitride, the material thereof is not limited thereto. For example, the insulating film 15 may be composed of silicon oxide, silicon nitride, or an organic material such as acryl and polyimide. A region surrounded by the insulating film 15 on the first electrode 14 (aperture) corresponds to a light emitting region. Though the planar shape of the aperture (light emitting region) is not particularly limited, the planar shape thereof is a rectangle in this embodiment. The planar shape thereof may be a triangle or a circle according to the pixel arrangement. The organic layer 16 and the upper electrode 17 are provided commonly to the organic EL devices 10R, 10G, and 10B, and are provided not only over the aperture on the first electrode 14 but also over the insulating film 15. However, light is generated only in the aperture of the insulating film 15. To prevent the area of the aperture from being decreased, the vertical cross-sectional shape of the internal wall surface 15A of the insulating film 15 is preferably a forward tapered shape. The insulating film 15 preferably has a thickness about from 10 nm to 100 nm both inclusive. It is more preferable that the total of the thickness of the section of the first electrode 14 ground in forming the corner section 15B in the insulating film 15 and the thickness of the insulating film 15 be equal to or smaller than 100 nm. In the case where the thickness of the insulating film 15 is smaller than 10 nm, side surfaces of the first electrode 14 may be exposed. Meanwhile, in the case where the thickness of the insulating film 15 is larger than 100 nm, the second electrode may be disconnected.

Figure 4:
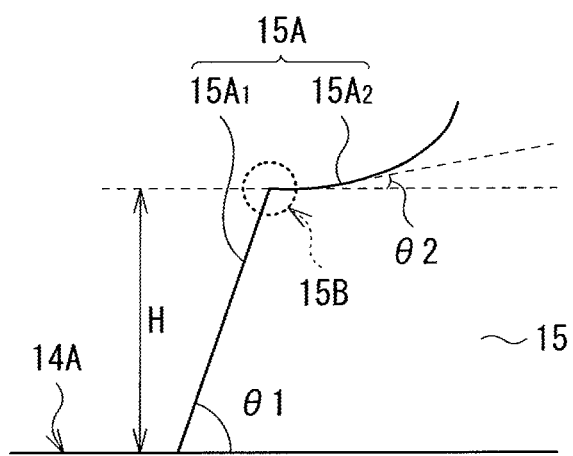
FIG. 4 is an enlarged cross-sectional view of the insulating film illustrated in FIG. 3.

As illustrated in the cross-sectional structure of FIG. 4, the insulating film 15 has one or more corner sections 15B in a face from a top to a surface 14A of the first electrode 14 on the aperture side of the insulating film 15, that is, in the internal wall surface 15A contacted with the organic layer 16. In this case, as an example, the insulating film 15 has one corner section 15B. The corner section 15B is provided so that the ridge line thereof is practically in parallel with a surface (horizontal surface) 14A of the first electrode 14. As a result of providing such a corner section 15B, the internal wall surface 15A has two faces $15A_1$ and $15A_2$ each having different inclined angle bounded by the ridge line of the corner section 15B. Being practically in parallel includes an manufacturing error. In this case, an angle made by the face $15A_1$ on the first electrode 14 side (first face) and the surface 14A of the first electrode 14 is θ1, and an angle made by the face $15A_2$ on the second electrode 17 side (second face) and the surface 14A of the first electrode 14 is θ2. As described above, since the cross-sectional shape of the insulating film 15 is preferably a forward tapered shape, θ1>θ2 is satisfied. In this embodiment, as will be described later, the face $15A_1$ having a large inclined angle mainly has a function to secure the area of the aperture and to locally increase a resistance value of the organic layer 16 (after-mentioned hole injection layer 16A) contacted with the insulating film 15. Meanwhile, the face $15A_2$ having a small inclined angle mainly has a function to prevent disconnection of the second electrode 17 and deterioration of the organic layer 16 due to current concentration (electric field concentration). That is, if the internal wall face 15A of the insulating film 15 has a large inclination with respect to the second electrode 17, disconnection of the second electrode 17 and current concentration due to the locally thinned organic layer 16 are easily generated. Therefore, with the use of the face $15A_2$ having a small inclined angle, coverage of the organic layer 16 is improved, and disconnection of the second electrode 17 and current concentration generation are suppressed.

Figure 5A:
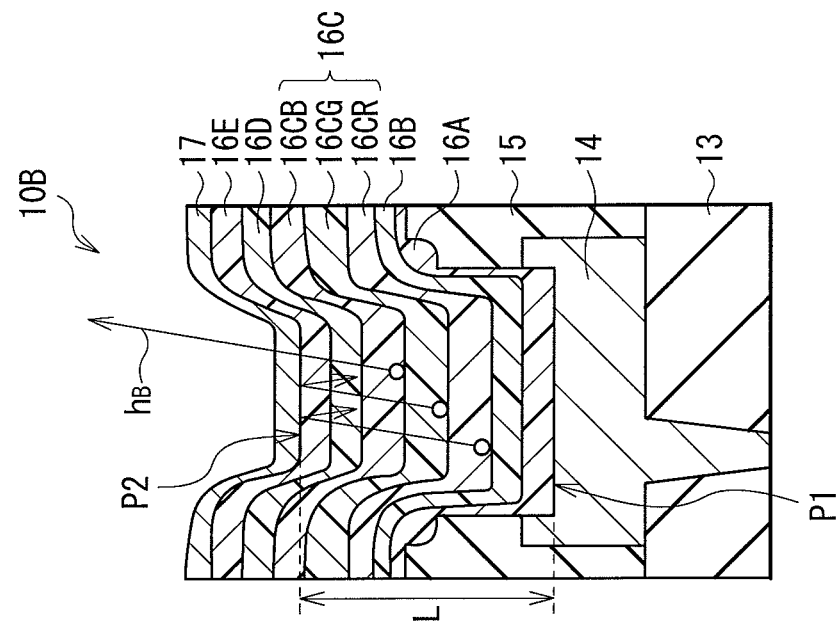
FIGS. 5A to 5C are enlarged cross-sectional views of the organic EL device illustrated in FIG. 3.
Figure 5B:
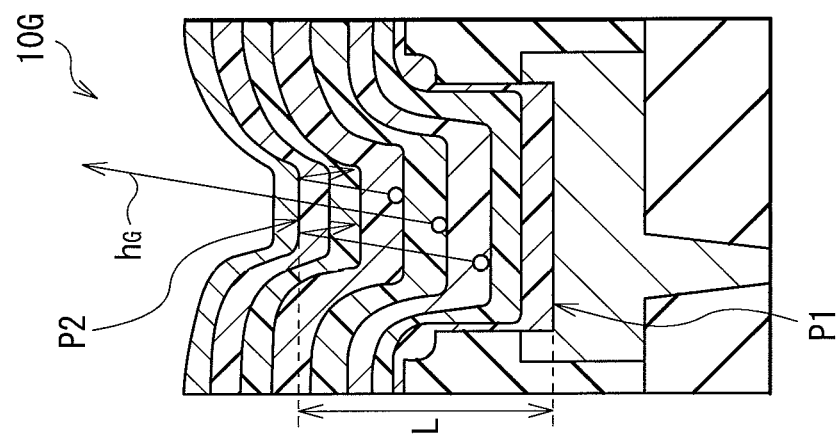
Figure 5C:
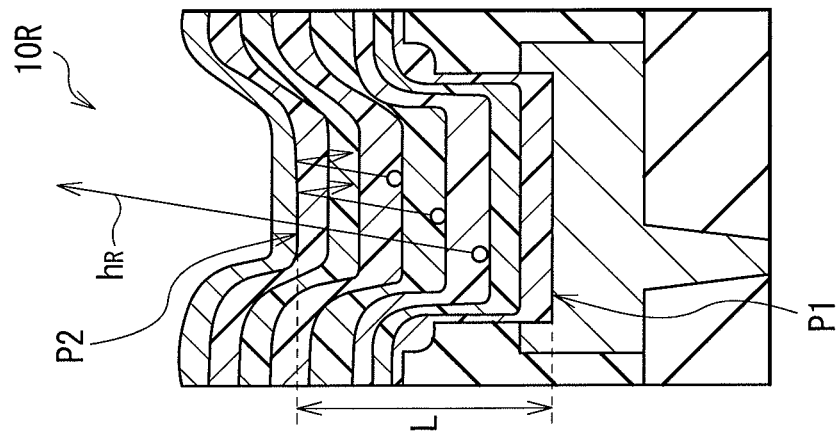

The structure of the organic layer 16 is identical without relation to each light emitting color of the organic EL devices 10R, 10G, and 10B. As illustrated in FIG. 5, for example, in the organic layer 16, the hole injection layer 16A, an electron hole transport layer 16B, a light emitting layer 16C, an electron transport layer 16D, and an electron injection layer 16E are layered in this order from the first electrode 14 side.

Respective light emitting layers for red, green and blue may be provided for the respective organic EL devices 10R, 10G, and 10B. However, to obtain high resolution and improve the aperture ratio, the light emitting layer preferably has a common structure as described above. However, in the case of using a common light emitting layer, drive current leakage is easily occurred between adjacent devices through the organic layer (in particular, through the hole injection layer). Due to the leakage current, there is a possibility that a non-light emitting pixel is influenced by the light emitting pixels and emits light, leading to lowered light emitting efficiency. As in Japanese Unexamined Patent Application Publication No. 2009-4347, the method of once forming an inverse tapered-shaped insulating film and subsequently reforming the insulating film into a forward tapered-shaped insulating film has been proposed. However, in the case where heat treatment is performed in the course of a manufacturing process, particularly after forming an organic layer, a possibility of deterioration of device characteristics are high.

In this embodiment, in the internal wall surface 15A of the insulating film 15, the inclined angle of the surface 15A$_1$ on the first electrode 14 side is high. Therefore, the film thickness of the hole injection layer 16A directly above the face 15A$_1$ is comparatively smaller than that of the other sections. Thereby, a resistance value of the hole injection layer 16A between the organic EL devices 10R, 10G, and 10B adjacent to each other is locally increased, and leakage current generation is suppressed.

The hole injection layer 16A is intended to improve hole injection efficiency, and is a buffer layer to prevent leakage. The hole injection layer 16A has a thickness of, for example, from 5 nm to 300 nm both inclusive, and is provided over the whole surface of the substrate 11 as what we call a solid film without being patterned. For example, the hole injection layer 16A is composed of a hexaazatriphenylene derivative shown in Chemical formula 1 or Chemical formula 2.

[Chemical formula 1]

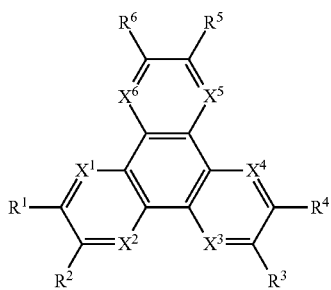

In Chemical formula 1, R1 to R6 are respectively and independently hydrogen, a halogen a hydroxyl group, an amino group, an arylamino group, a substituent/non-substituent carbonyl group with the carbon number equal to or less than 20, a substituent/non-substituent carbonyl ester group with the carbon number equal to or less than 20, a substituent/non-substituent alkyl group with the carbon number equal to or less than 20, a substituent/non-substituent alkenyl group with the carbon number equal to or less than 20, a substituent/non-substituent alkoxyl group with the carbon number equal to or less than 20, a substituent/non-substituent aryl group with the carbon number equal to or less than 30, a substituent/non-substituent heterocyclic group with the carbon number equal to or less than 30, or one of substituent groups selected from a nitrile group, a cyano group, a nitro group, and a silyl group. Adjacent Rm (m: one of 1 to 6) may be bonded to each other through a cyclic structure. Further, X1 to X6 are respectively and independently a carbon atom or a nitrogen atom.

[Chemical formula 2]

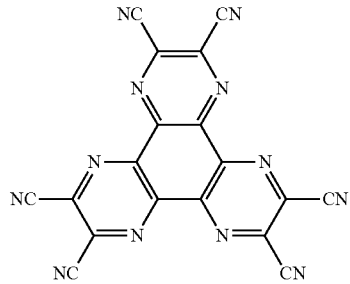

The electron hole transport layer 16B is intended to improve hole injection efficiency to the light emitting layer 16C. In the light emitting layer 16C, if an electric field is applied, electron-hole recombination is generated, and thereby light is generated. The electron transport layer 16D is intended to improve electron transport efficiency to the light emitting layer 16C. The electron injection layer 16E is intended to improve electron injection efficiency to the light emitting layer 16C.

The electron hole transport layer 16B has a thickness of, for example, about nm, and is composed of 4,4',4''-tris(3methylphenylamino)triphenylamine (m-MTDATA) or α-naphthylphenyldiamine (αNPD).

The light emitting layer 16C is a white light emitting layer having, for example, a red light emitting layer 16CR, a green light emitting layer 16CG, and a blue light emitting layer 16CB that are layered on each other between the first electrode 14 and the second electrode 17. The red light emitting layer 16CR, the green light emitting layer 16CG, and the blue light emitting layer 16CB are layered in this order from the first electrode 14 side as an anode. The red light emitting layer 16CR generates red light by recombination of part of electron holes injected from the first electrode 14 through the hole injection layer 16A and the electron hole transport layer 16B and part of electrons injected from the second electrode 17 through the electron injection layer 16E and the electron transport layer 16D by being applied with an electric field. The green light emitting layer 16CG generates green light by recombination of part of electron holes injected from the first electrode 14 through the hole injection layer 16A and the electron hole transport layer 16B and part of electrons injected from the second electrode 17 through the electron injection layer 16E and the electron transport layer 16D by being applied with an electric field. The blue light emitting layer 16CB generates blue light by recombination of part of electron holes injected from the first electrode 14 through the hole injection layer 16A and the electron hole transport layer 16B and part of electrons injected from the second electrode 17 through the electron injection layer 16E and the electron transport layer 16D by being applied with an electric field.

The red light emitting layer 16CR contains, for example, one or more of a red light emitting material, an electron hole transport material, an electron transport material, and a both electric charge transport material. The red light emitting material may be a fluorescent material or a phosphoric material. In this embodiment, the red light emitting layer 16CR has a thickness of, for example, about 5 nm, and is composed of a compound obtained by mixing 30 wt % of 2,6-bis[(4'-methoxydiphenylamino)styryl]-1,5 dicyanonaphthalene (BSN) to 4,4-bis(2,2-diphenylvinyl)biphenyl (DPVBi).

The green light emitting layer 16CG contains, for example, one or more of a green light emitting material, an electron hole transport material, an electron transport material, and a both electric charge transport material. The green light emitting material may be a fluorescent material or a phosphoric material. In this embodiment, the green light emitting layer 16CG has a thickness of, for example, about 10 nm, and is composed of a compound obtained by mixing 5 wt % of coumarin 6 to DPVBi.

The blue light emitting layer 16CB contains, for example, one or more of a blue light emitting material, an electron hole transport material, an electron transport material, and a both electric charge transport material. The blue light emitting material may be a fluorescent material or a phosphoric material. In this embodiment, the blue light emitting layer 16CB has a thickness of, for example, about 30 nm, and is composed of a compound obtained by mixing 2.5 wt % of 4,4'-bis[2-{4-(N,N-diphenylamino)phenyl}vinyl]biphenyl (DPAVBi) in DPVBi.

The electron transport layer 16D has a thickness of, for example, about 20 nm, and is composed of 8-hydroxyquinolinealuminum (Alq3).

The electron injection layer 16E has a thickness of, for example, about 0.3 nm, and is composed of LiF, $Li_2O$, or the like.

As will be described later, the organic EL devices 10R, 10G, and 10B have a resonator structure in which the organic layer 16 works as a resonance section. To realize appropriate adjustability of distance from the light emitting point to the reflecting surface, the film thickness of the organic layer 16 is preferably from 80 nm to 500 nm both inclusive, and is more preferably from 150 nm to 350 nm both inclusive.

The second electrode 17 is composed of a metal conductive film to cover all the organic EL devices 10R, 10G, and 10B. Specific material examples thereof include an alloy of aluminum (Al), magnesium (Mg), calcium (Ca), or sodium (Na). Specially, an alloy of magnesium and silver (Mg—Ag alloy) is preferable, since the Mg—Ag alloy has both electric conductivity and small absorption in a thin film. Though the ratio of magnesium and silver in the Mg—Ag alloy is not particularly limited, the film thickness ratio of Mg:Ag is desirably in the range from 20:1 to 1:1. Further, the material of the second electrode 17 may be an alloy of aluminum (Al) and lithium (Li) (Al—Li alloy).

Further, the second electrode 17 has a function as a semi-transmissive reflecting layer. That is, the organic EL devices 10R, 10G, and 10B have a resonance structure in which the surface of the reflecting layer surface of the first electrode 14 is a first end section P1, the rear surface of the semi-transmissive reflecting layer of the second electrode 17 is a second end section P2, the organic layer 16 is a resonance section, and light generated in the light emitting layer 16C is resonated and is extracted from the second end section P2 side (FIG. 5). In the case where such a resonance structure is included, the light generated in the light emitting layer 16C generates multiple interference, and a kind of narrowband filter works. Thereby, the half-width of extracted light spectrum is decreased and color purity is able to be improved, which is preferable.

To that end, optical distance L between the first end section P1 and the second end section P2 of the resonator preferably satisfies Mathematical expression 1, and resonance wavelength of the resonator (peak wavelength of spectrum of extracted light) preferably corresponds with peak wavelength of spectrum of light desired to be extracted. The optical distance L is preferably selected to become a positive minimum value satisfying Mathematical expression 1.

$$(2L)/\lambda + \Phi/(2\pi) = m \quad \text{(Mathematical expression 1)}$$

In the expression, L represents optical distance between the first end section P1 and the second end section P2, Φ represents sum of phase shift Φ1 of reflected light generated in the first end section P1 and phase shift Φ2 of reflected light generated in the second end section P2 (Φ=Φ1+Φ2) (rad), λ represents peak wavelength of spectrum of light desired to be extracted from the second end section P2 side, and m represents an integer number with which L becomes positive. In Mathematical expression 1, L and λ should have a common unit, and for example, (nm) is used as the unit thereof.

The protective film 18 is composed of silicon nitride (SiNx), silicon oxide, a metal oxide, or the like. The adhesive layer 30 is composed of, for example, a thermosetting resin or an ultraviolet curing resin.

The sealing panel 20 is located on the second electrode 17 side of the organic EL devices 10R, 10G, and 10B. The sealing panel 20 seals the organic EL devices 10R, 10G, and 10B together with the adhesive layer 30. The sealing panel 20 is composed of a sealing substrate 21 made of a material such as glass transparent to light generated in the organic EL devices 10R, 10G, and 10B and a color filter 22 provided on one surface of the sealing substrate 21. The color filter 22 extracts light generated in the organic EL devices 10R, 10G, and 10B, and absorbs outside light reflected by the organic EL devices 10R, 10G, and 10B and the wiring therebetween to improve contrast.

Though the color filter 22 may be provided on either surface of the sealing substrate 21, the color filter 22 is preferably provided on the organic EL devices 10R, 10G, and 10B side, since thereby the color filter 22 is not exposed on the surface and is allowed to be protected by the adhesive layer 30. Further, in this case, since distance between the light emitting layer 16C and the color filter 22 is decreased, light outputted from the light emitting layer 16C is avoided from entering another color filter 22 adjacent to the relevant color filter 22 and generating mixed color. The color filter 22 has a red filter 22R, a green filter 22G, and a blue filter (not illustrated), which are sequentially arranged correspondingly to the organic EL devices 10R, 10G, and 10B.

The red filter 22R, the green filter 22G, and the blue filter (not illustrated) are respectively formed in the shape of, for example, a rectangle without space in between. The red filter 22R, the green filter 22G, and the blue filter are respectively made of a resin mixed with a pigment. Adjustment is made by selecting a pigment so that light transmittance in the intended red, green, or blue wavelength region is high, and light transmittance in the other wavelength regions is low.

Further, the wavelength region with high transmittance in the color filter 22 corresponds with the peak wavelength λ of spectrum of light desired to be extracted from the resonator structure. Thereby, of outside light entering from the sealing substrate 21, only outside light having wavelength equal to the peak wavelength λ of the spectrum of the light desired to be extracted is transmitted through the color filter 22, and outside light having the other wavelength is prevented from entering the organic EL devices 10R, 10G, and 10B.

The display unit 1 is able to be manufactured, for example, as follows.

First, the pixel drive circuit 140 (drive circuit layer 12) including the drive transistor Tr1 is formed on the substrate 11 made of the foregoing material. After that, the whole surface thereof is coated with a photosensitive resin. The photosensitive resin is provided with exposure and development, and patterning is made in a given shape to form the planarizing layer 13. At the same time as the patterning, the connection hole 13A and the plug 13B are formed.

Next, a metal film such as chromium is formed by, for example, sputtering method. After that, wet etching is performed to form the first electrode 14 separated according to the respective organic light emitting devices 10R, 10G, and 10B.

Subsequently, a silicon oxynitride film having a film thickness of, for example, 50 nm is formed over the whole surface of the substrate 11. After that, patterning is made to provide an aperture corresponding to the light emitting region. After the patterning, inverse sputtering process is performed over the whole surface of the substrate 11, and thereby a corner of the surface of the silicon oxynitride film (surface opposed to the sealing panel 20) is ground to form the insulating film 15 having the corner section 15B. The inverse sputtering process is performed by, firstly introducing argon (Ar) into a vacuum chamber to generate plasma discharge under low vacuum, subsequently making ionized Ar collide against the whole surface of the substrate 11, and flicking and grinding the elements of the surface of the silicon oxynitride film. The inclined angle $\theta 2$ of one face 15A$_2$ composing the internal wall surface 15A of the insulating film 15 is adjustable by inverse sputtering process time.

After that, the hole injection layer 16A, the electron hole transport layer 16B, the light emitting layer 16C, the electron transport layer 16D, and the electron injection layer 16E of the organic layer 16 that have the foregoing thickness and are made of the foregoing material are formed over the whole surface of the substrate 11 by, for example, vacuum evaporation method, sputtering method, or coating method such as spin coating method and die coating method.

After the organic layer 16 is formed, the second electrode 17 that has the foregoing thickness and is made of the foregoing material is formed over the whole surface of the substrate 11 by, for example, evaporation method. Thereby, the organic EL devices 10R, 10G, and 10B are formed.

Subsequently, the protective film 18 made of the foregoing material is formed on the organic EL devices 10R, 10G, and 10B by, for example, CVD method or sputtering method.

Further, for example, the sealing substrate 21 made of the foregoing material is coated with a material of the red filter 22R by spin coating or the like. The resultant is patterned by photolithography technique, fired, and thereby the red filter 22R is formed. Subsequently, the blue filter and the green filter 22G are sequentially formed in the same manner as that of the red filter.

After that, the adhesive layer 30 is formed on the protective film 18, and the sealing substrate 21 is bonded to the protective layer 18 with the adhesive layer 30 in between. At this time, the surface on which the color filter 22 is formed of the sealing substrate 21 is preferably arranged on the organic EL devices 10R, 10G, and 10B side. Accordingly, the display unit 1 illustrated in FIG. 1 to FIG. 3 is completed.

In the display unit 1, the scanning signal is supplied to each pixel through the gate electrode of the writing transistor Tr2 from the scanning line drive circuit 130, and the image signal from the signal line drive circuit 120 is retained in the retentive capacity Cs through the writing transistor Tr2. In other words, the drive transistor Tr1 is on/off-controlled according to the signal retained in the retentive capacity Cs, and thereby drive current Id is injected into the respective organic EL devices 10R, 10G, and 10B, electron-hole recombination is generated, and thereby light is emitted. The light is multiply reflected between the first electrode 14 (first end section P1) and the second electrode 17 (second end section P2), is transmitted through the second electrode 17, the color filter 22, and the sealing substrate 21, and is extracted. At this time, according to the optical distance L between the first end section P1 and the second end section P2 of the organic EL devices 10R, 10G, and 10B, only red light $h_R$ in the organic EL device 10R, only $h_G$ in the organic EL device 10G, and only $h_B$ in the organic EL device 10B are multiply reflected between the first end section P1 and the second end section P2, are transmitted through the second electrode 17, and are extracted. In the display unit 1 having the foregoing top emission structure, emitted light form the light emitting layer 16C is not blocked by the TFT (drive circuit layer 12). Therefore, the display unit having the foregoing top emission structure is more superior to a bottom emission structure in terms of light extraction efficiency. Further, high definition characteristics are able to be realized more easily in the top emission structure than in the bottom emission structure.

In this case, as described above, the corner section 15B is provided in the internal wall surface 15A of the insulating film 15 as a device separation film. Therefore, the internal wall surface 15A has two faces 15A$_1$ and 15A$_2$ each having different inclined angle with respect to the surface 14A of the first electrode 14. Thereby, in this embodiment, disconnection of the second electrode over the insulating film 15 and current concentration are able to be suppressed, the aperture size is allowed to be secured, and a resistance value of the organic layer 16 existing between the organic EL devices 10R, 10G, and 10B adjacent to each other is able to be increased. For details thereof, a description will be hereinafter given.

Figure 6:
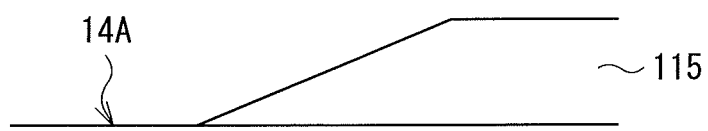
FIG. 6 is a cross-sectional view illustrating a configuration of an insulating film according to a comparative example.

As illustrated in FIG. 6, an existing insulating film 115 is formed to incline at a given angle (for example, about from 20 deg to 40 deg both inclusive) with respect to the first electrode 14 in order to prevent disconnection of the second electrode 17 and current concentration. However, the existing insulating film 115 is not provided with the corner section 15B. Therefore, there is a high possibility that a leakage current flows between the organic EL devices 10R, 10G, and 10B adjacent to each other, leading to mixed color and lowered light emitting efficiency. Further, to prevent disconnection of the second electrode 17 and current concentration, its taper angle is not able to be increased. Furthermore, the first electrode 14 is covered with the insulating film by considering alignment precision of an exposure apparatus used in forming the insulating film 115. Therefore, the area covered with the insulating film 115 of the surface of the first electrode is increased. Thereby, the aperture ratio and the precision are lowered. Accordingly, it is difficult to apply the existing insulating film to a super-small and high-definition display unit such as an EVF (Electronic View Finder).

Meanwhile, in the organic EL devices 10R, 10G, and 10B of this embodiment, the two faces 15A$_1$ and 15A$_2$ each having different inclined angle are formed in the internal wall surface 15A of the insulating film 15 by inverse sputtering process. In addition, since the inclined angle ($\theta 2$) of the face 15A$_2$ on the second electrode 17 side is relatively moderate, inclination of the second electrode 17 over the insulating film 15 becomes moderate as well. Therefore, disconnection of the second electrode 17 and current concentration between the first electrode 14 and the second electrode 17 are suppressed. Further, though details will be described later, disconnection between the second electrode 17 and current concentration between the first electrode 14 and the second electrode 17 are prevented more effectively by adjusting height H from the surface 14A of the first electrode 14 to the corner section 15B. Meanwhile, the inclined angle (θ1) of the face 15A$_1$ on the first electrode 14 side is relatively precipitous. Therefore, the film thickness of the organic layer 16 being in contact with the insulating film 15, in particular, the film thickness of the hole injection layer 16A becomes small locally. Therefore, a resistance value of the hole injection layer 16A, that is, a resistance value of the organic layer 16 becomes high, and a leakage current generation between the organic EL devices 10R, 10G, and 10B adjacent to each other is suppressed. Further, an area of a section where the insulating film 15 is layered on the first electrode 14 is able to be decreased, and the display unit 1 with a high aperture ratio and high-definition characteristics is able to be realized.

Figure 7:
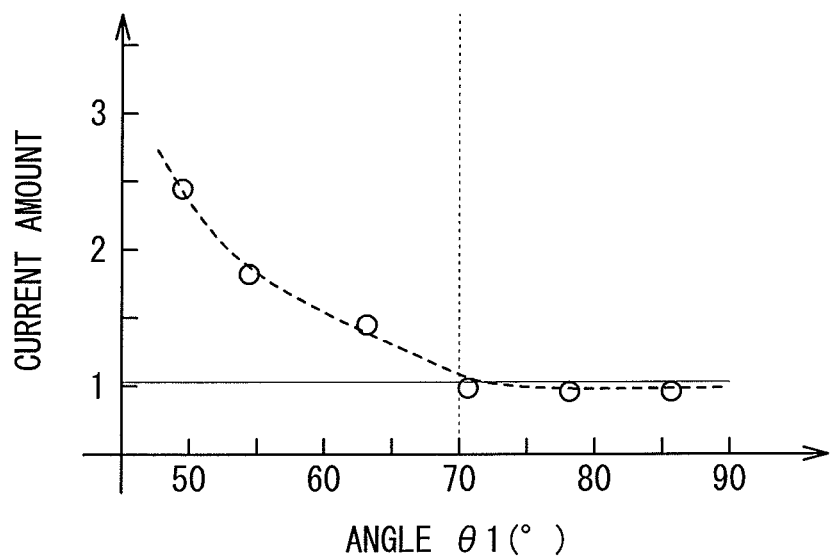
FIG. 7 is a diagram illustrating relation between an angle (θ1) made by a first face out of an internal wall surface of the insulating film and a surface of a first electrode and a current amount.

FIG. 7 illustrates relation between the angle θ1 and a leakage current generation where the vertical axis indicates a current amount and the horizontal axis indicates the angle θ1. The current amount in the vertical axis is a normalized value in which a necessary current amount where the angle θ1 is 70 deg is 1. As illustrated in FIG. 7, the angle θ1 is preferably a value equal to or larger than 70 deg and smaller than 90 deg (70 deg≤θ1≤90 deg), since suppression effect of abnormal light emission due to a leakage current is improved.

Figure 8:
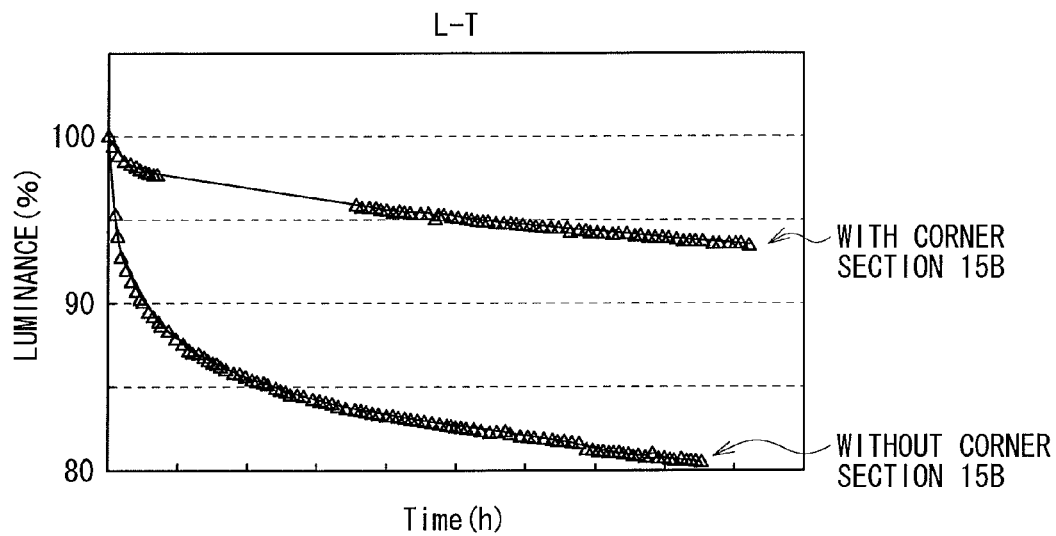
FIG. 8 is a diagram to explain luminance degradation deference according to presence of a corner section.

FIG. 8 illustrates luminance degradation rate (%) varying according to presence of the corner section 15B where θ1 is 80 deg. In the case where the corner section 15B does not exist, the luminance is decreased down to 80% after certain time elapses. However, in the case where the corner section 15B exists, the luminance of about 95% is able to be retained after certain time elapses. That is, in the case where the angle θ1 is 80 deg, though leakage current is able to be suppressed, the organic layer 16 is locally thinned if the corner section 15B does not exist. Accordingly, in this case, deterioration of the organic EL devices 10R, 10G, and 10B due to current concentration is significant.

Figure 9:
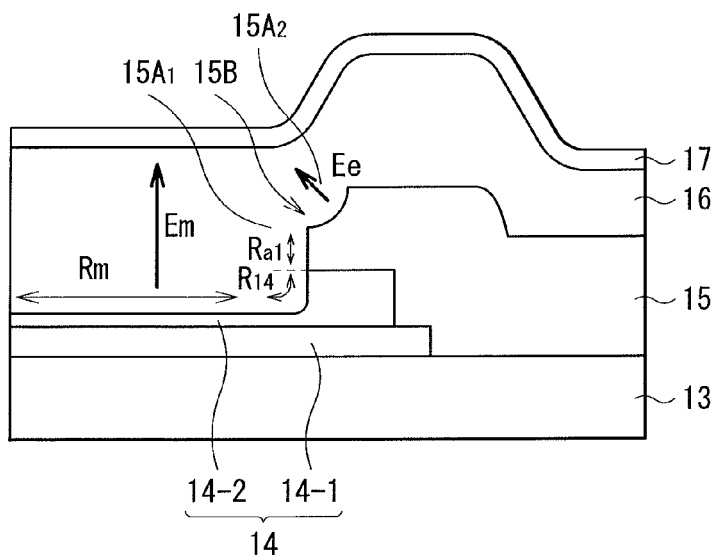
FIG. 9 is a diagram to explain edge light emission.

Examples of causes of luminance degradation include edge light emission. As illustrated in FIG. 9, in addition to normal light emission Em from the aperture of the insulating film 15, that is, from the portion formed as the light emitting region, in some cases, edge light emission Ee is generated from the internal wall surface 15A in the taper-shaped insulating film 15. Where a resistance value of the organic layer 16 in the light emitting region is $R_m$, a resistance value of the organic layer 16 being in contact with a step portion of the first electrode 14 (portion ground at the time of forming the corner section 15B) is $R_{14}$, and a resistance value of the organic layer 16 being in contact with the face 15A$_1$ is $R_{a1}$, $R_m < R_{a1} + R_{14}$ is preferably satisfied in order to suppress the edge light emission Ee. The resistance value of the organic layer 16 is adjustable mainly by the thickness of the hole injection layer 16A. The angles θ1 and θ2 and the height H may be determined so that the relation of $R_m < R_{a1} + R_{14}$ is satisfied.

Figure 10:
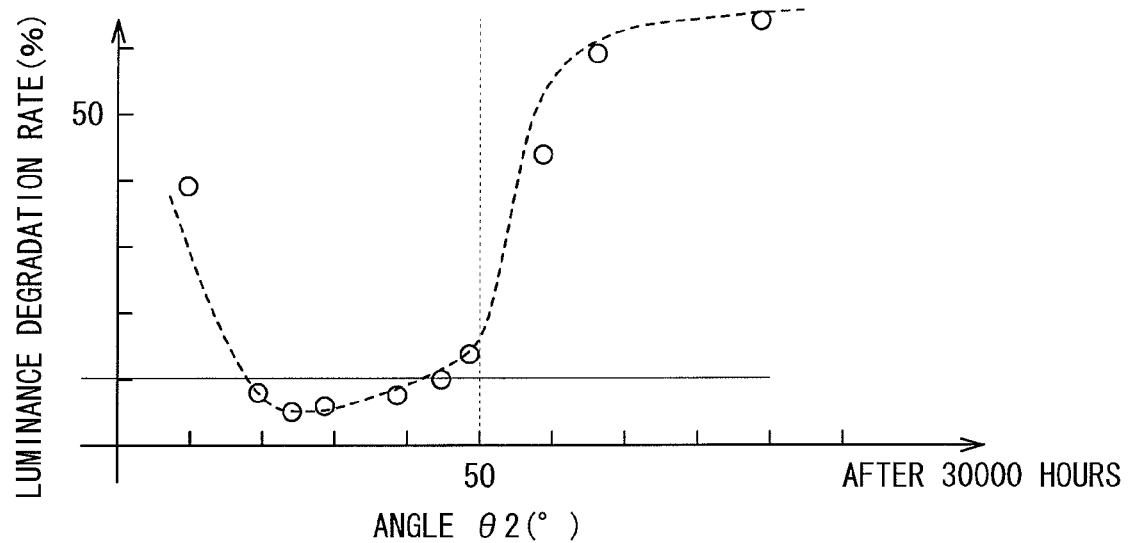
FIG. 10 is a diagram illustrating relation between an angle (θ2) made by a second face out of the internal wall surface of the insulating film and the surface of the first electrode and luminance degradation.

In order to prevent luminance degradation due to the foregoing edge light emission and the foregoing current concentration, the angle θ2 is preferably equal to or smaller than 50 deg, and is more preferably from 20 deg to 45 deg both inclusive (20 deg≤θ2≤45 deg) for the following reason. As illustrated in FIG. 10, in the case where the angle θ2 is equal to or smaller than 50 deg, luminance degradation rate after 30000 hours is able to be decreased down to a value smaller than 20%, and in the case where 20 deg≤θ2≤45 deg is satisfied, luminance degradation rate after 30000 hours is able to be decreased down to a value smaller than 10%.

Figure 11:
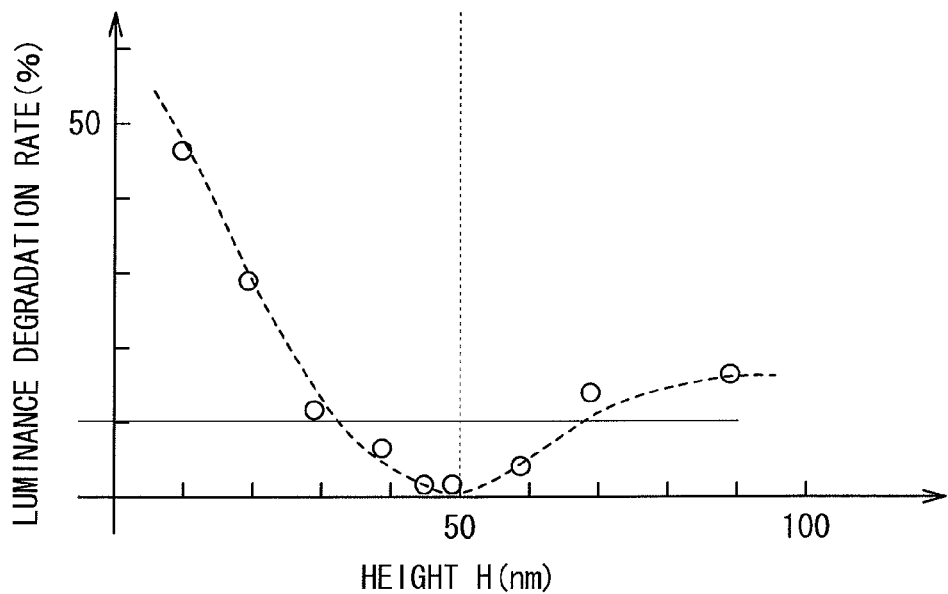
FIG. 11 is a diagram illustrating relation between height (H) from the surface of the first electrode to the corner section and luminance degradation rate.

Further, the height H from the surface 14A of the first electrode 14 (surface in the thinned portion) to the corner section 15B (FIG. 4) is preferably from 30 nm to 70 nm both inclusive (30 nm≤H≤70 nm) for the following reason. As illustrated in FIG. 11, in the case where the height H is smaller than 30 nm, luminance degradation due to edge light emission is significant. Meanwhile, in the case where the height H is larger than 70 nm, luminance degradation due to disconnection of the second electrode 17 and current concentration is occurred. In the case where 30 nm≤H≤70 nm is satisfied, luminance degradation rate is able to be decreased down to about 10%. By appropriately setting the angles θ1 and θ2 and the height H, light emission efficiency is able to be improved by 40% compared to in a case that the corner section 15B is not provided.

As described above, in the organic EL devices 10R, 10G, and 10B of this embodiment, since the internal wall surface 15A of the insulating film 15 is provided with the corner section 15B in parallel with the surface 14A of the first electrode 14, disconnection of the second electrode 17 and current concentration are suppressed, and the aperture ratio is able to be improved. Further, the resistance value of the organic layer 16 (hole injection layer 16A) existing between the organic EL devices 10R, 10G, and 10B adjacent to each other is able to be increased. Therefore, lowering of light emitting efficiency associated with leakage current is suppressed, and characteristics deterioration of the organic EL devices 10R, 10G, and 10B are able to be prevented. In particular, the organic EL devices 10R, 10G, and 10B according to this embodiment are effective for white light emitting display units in which the organic layer 16 is formed over the whole surface of the substrate 11.

A description will be hereinafter given of a modification of the foregoing embodiment and another embodiment. In the following description, for the same components as the components in the foregoing embodiment, the same referential symbols are affixed thereto, and the description thereof will be omitted as appropriate.

(Modification)

Figure 12:
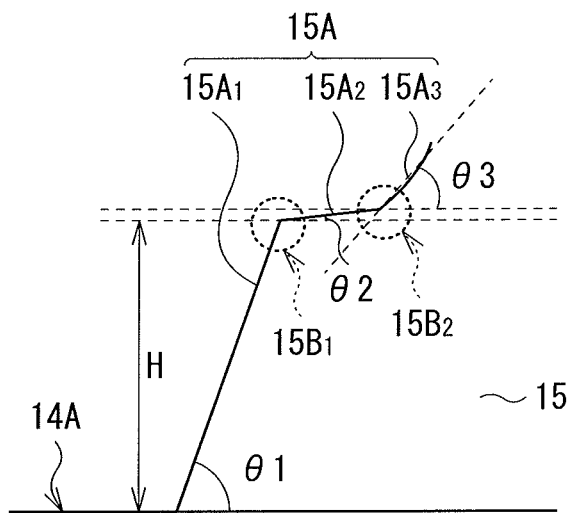
FIG. 12 is a cross-sectional view according to a modification of the insulating film illustrated in FIG. 4.

FIG. 12 illustrates a cross-sectional structure of the insulating film 15 according to the modification. The insulating film 15 is different from the foregoing embodiment in that the insulating film 15 has another corner section 15B$_2$ in addition to a corner section 15B$_1$.

The internal wall surface 15A of this modification has the two corner sections 15B$_1$ and 15B$_2$. Therefore, from the first electrode 14 side, inclined faces 15A$_1$, 15A$_2$, and 15A$_3$ each having different inclined angles θ1, θ2, and θ3 with respect to the surface 14A of the first electrode 14 exist. Since such a plurality of corner sections 15B exist, the organic layer 16 and the second electrode 17 are able to be located more alongside of the inclination of the internal wall surface 15A. Therefore, luminance degradation due to unevenness of the film thickness of the organic layer 16 is able to be prevented. It is needless to say that three or more corner sections 15B exist. The angle θ3 is preferably equal to or smaller than 50 deg, and it is more preferable that 20 deg≤θ3≤45 deg be satisfied as in the foregoing angle θ2.

Figure 13:
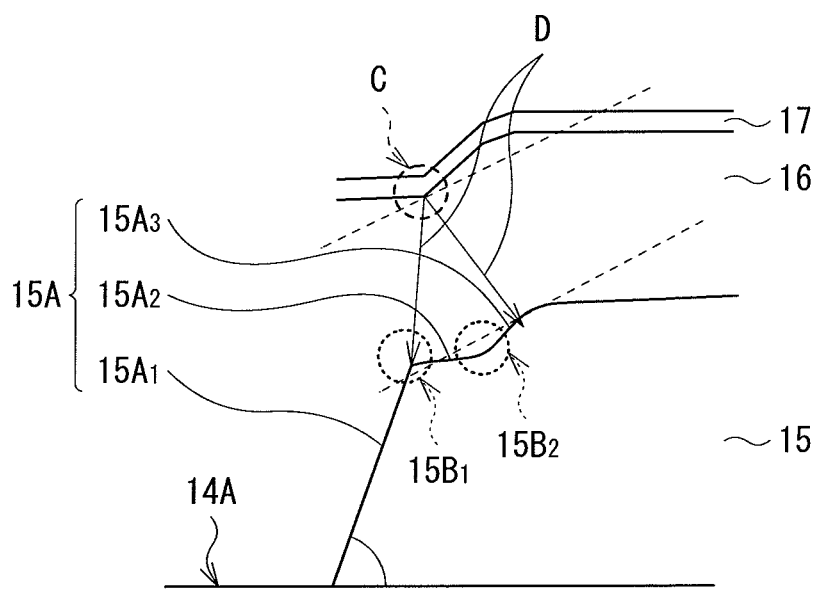
FIG. 13 is a diagram to explain preferable ranges of the angles θ2 and θ3 illustrated in FIG. 12.

As illustrated in FIG. 13, the angles θ2 and θ3 are preferably set so that distance D from position C located most proximal to the internal wall surface 15A of the insulating film 15 in the second electrode 17 to the internal wall surface 15A is identical in any position. If there is a difference in the distance D, a drive voltage in a portion where the distance D is shorter becomes lower, and thus light is dominantly emitted from the relevant section and deterioration is promoted.

Second Embodiment

Figure 14:
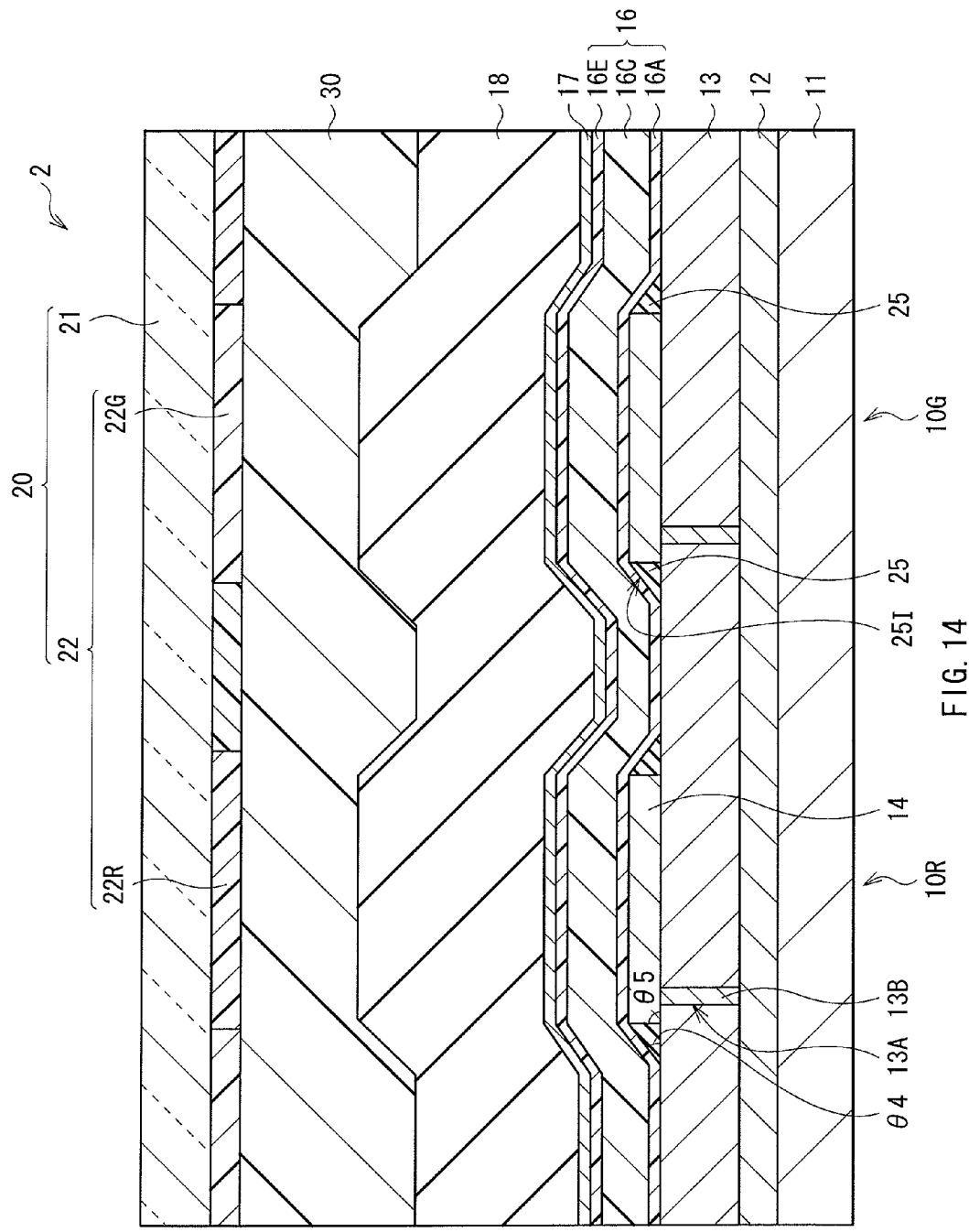
FIG. 14 is a view illustrating a configuration of a display unit according to a second embodiment of the present disclosure.

FIG. 14 illustrates a cross-sectional configuration of a display unit (display unit 2) according to the second embodiment of the present technology. The display unit 2 is different from the foregoing embodiment in that the shape of an insulating film 25 as a device separation film is different from that of the insulating film 15 of the foregoing embodiment.

The insulating film 25 is provided only on side surfaces (end faces) of the first electrode 14, and the entire surface of the first electrode 14 is exposed. A portion from the upper end to the lower end of the first electrode 14 is covered with the inclined insulating film 25. The insulating film 25 has an inclined surface (inclined surface 251) inclining at angle θ4 with respect to the substrate 11 (planarizing layer 13). The inclined surface 251 is a surface extending from the upper end to the lower end of the insulating film 25. Though the inclined surface 251 is preferably flat, the inclined surface 251 may have unevenness sufficiently small with respect to the film thickness of the insulating film 16. One end of the inclined surface 251 is in contact with the planarizing layer 13. That is, in the insulating film 25, a tapered shape is provided on the side surfaces of the first electrode 14. The respective insulating films 25 are separated from each other in a portion between adjacent organic EL devices (for example, the organic EL device 10R and the organic EL device 10G in FIG. 14). By the inclined surface 251 of the insulating film 25, degradation of the organic EL devices 10R, 10G, and 10B due to disconnection of the second electrode 17 and the organic layer 16 and current concentration of the second electrode 17 is able to be prevented. The angle θ4 is preferably equal to or smaller than 70 deg, and is more preferably from 30 deg to 60 deg both inclusive (30 deg≤θ4≤60 deg). The angle θ4 is adjusted as appropriate by the thickness of the organic layer 16 and the second electrode 17, pixel size, and inter-pixel distance.

The insulating film 25 is able to be formed, for example, as follows.

First, the planarizing layer 13 is provided in the same manner as that explained in the foregoing embodiment. After that, for example, a metal film being 100 nm thick is formed and the resultant is provided with etching, and thereby the first electrode 14 is formed. At this time, it is preferable that the etching be performed under high anisotropic characteristics by wet etching or a dry etching device, and a side surface of the first electrode 14 be approximately perpendicular to the substrate 11 (planarizing layer 13). An angle made by a side surface of the first electrode 14 and the substrate 11 (angle θ5) is, for example, from 80 deg to 90 deg both inclusive (80 deg≤θ5≤90 deg).

After the first electrode 14 is formed, a component material of the insulating film 25 being 300 nm thick is formed over the whole surface of the substrate 11. The resultant whole surface is uniformly provided with etching by using, for example a dry etching device. Next, such whole surface etching is stopped at the time of appearance of the surface of the first electrode 14, and thereby the insulating film 25 is able to be formed. Shape of the insulating film 25 (for example, the angle θ4) is controllable by thickness ratio between the first electrode 14 and the insulating film 25 and etching conditions.

In this embodiment, since the tapered shape of the insulating film 25 is provided on the side surface side of the first electrode 14, and the entire surface of the first electrode 14 is exposed, the aperture size is secured. The method of preventing disconnection of the organic layer and the like by forming a tapered shape in the first electrode without providing an insulating film (device separation film) has been proposed (for example, Japanese Unexamined Patent Application Publication No. 2001-110575). However, in this method, the tapered section of the first electrode 14 emits light as well, and therefore there is a possibility that light emitting efficiency is lowered and color shift occurs between pixels, for example. Meanwhile, in the display unit 2, the tapered shape is provided in the insulating film 25. Therefore, the aperture ratio is able to be improved without lowering light emitting efficiency and generating color shift.

(Module)

Figure 15:
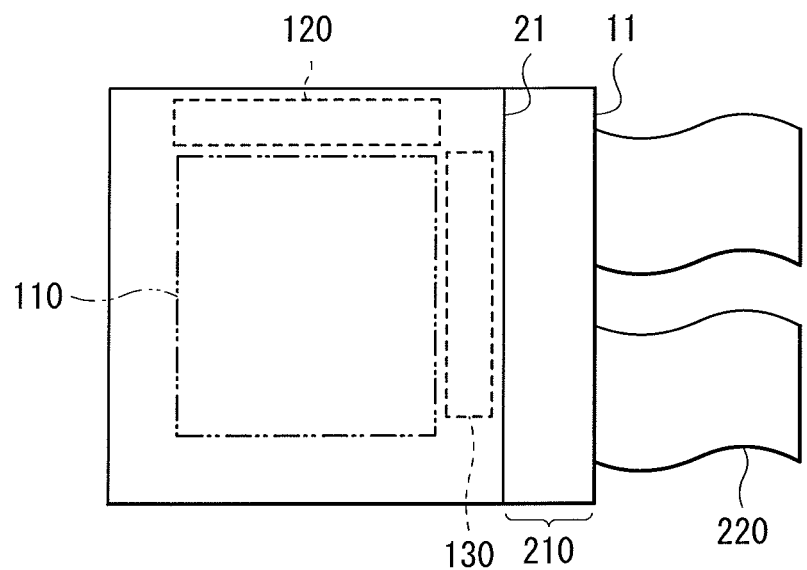
FIG. 15 is a plan view illustrating a schematic configuration of a module including the display unit illustrated in FIG. 3 and FIG. 14.

The display units 1 and 2 of the foregoing embodiments and the modification are incorporated in various electronic devices such as after-mentioned first to fifth application examples as a module as illustrated in FIG. 15, for example. The display units 1 and 2 are particularly suitable as a display such as a viewfinder of a video camcorder and a single-lens reflex camera and a head-mounted display that demands high resolution and is used by zooming an image before eyes. In the module, for example, a region 210 exposed from the sealing substrate 21 and the adhesive layer 30 is provided on a side of the substrate 11, and an external connection terminal (not illustrated) is formed in the exposed region 210 by extending the wirings of the signal line drive circuit 120 and the scanning line drive circuit 130. The external connection terminal may be provided with a Flexible Printed Circuit (FPC) 220 for inputting and outputting a signal.

First Application Example

Figure 16:
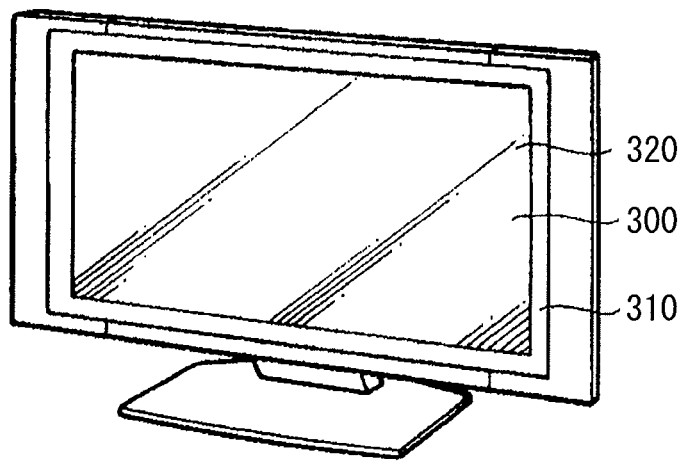
FIG. 16 is a perspective view illustrating an appearance of a first application example.

FIG. 16 illustrates an appearance of a television device to which the display units 1 and 2 of the foregoing embodiments are applied. The television device has, for example, an image display screen section 300 including a front panel 310 and a filter glass 320. The image display screen section 300 is composed of the display unit 1 according to the foregoing embodiment.

Second Application Example

Figure 17A:
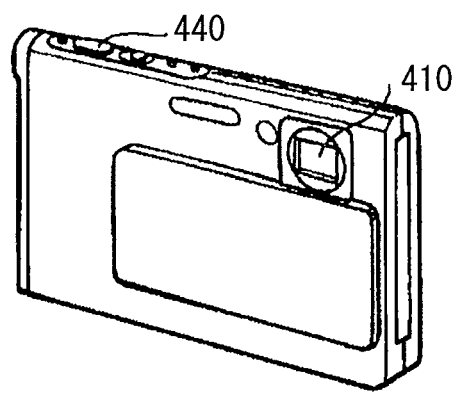
FIG. 17A is a perspective view illustrating an appearance viewed from the front side of a second application example.
Figure 17B:
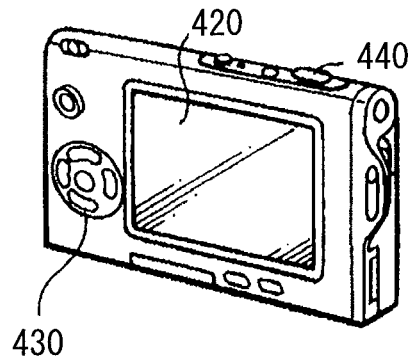
FIG. 17B is a perspective view illustrating an appearance viewed from the rear side of the second application example.

FIGS. 17A and 17B illustrate appearances of a digital camera to which the display units 1 and 2 of the foregoing embodiments are applied. The digital camera has, for example, a light emitting section for a flash 410, a display section 420, a menu switch 430, and a shutter button 440. The display section 420 is composed of the display unit 1 according to the foregoing embodiment.

Third Application Example

Figure 18:
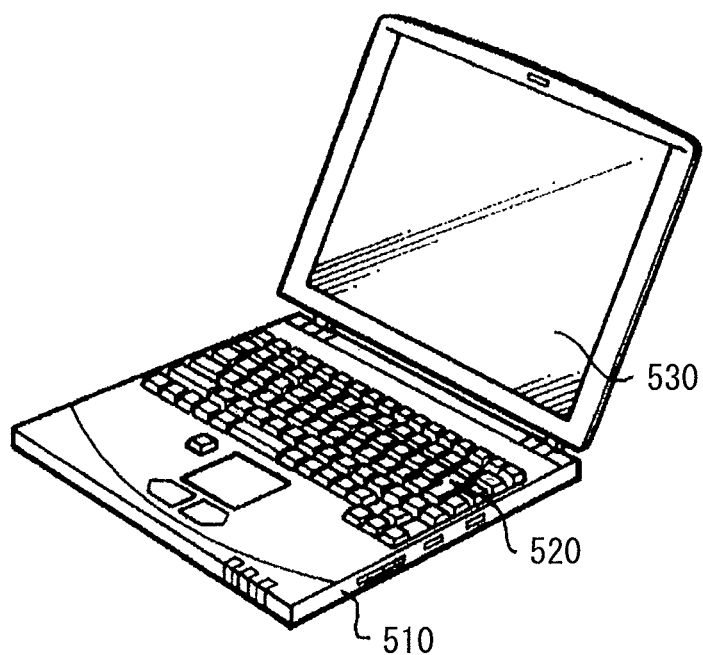
FIG. 18 is a perspective view illustrating an appearance of a third application example.

FIG. 18 illustrates an appearance of a notebook personal computer to which the display units 1 and 2 of the foregoing embodiments are applied. The notebook personal computer has, for example, a main body 510, a keyboard 520 for operation of inputting characters and the like, and a display section 530 for displaying an image. The display section 530 is composed of the display unit 1 according to the foregoing embodiment.

Fourth Application Example

Figure 19:
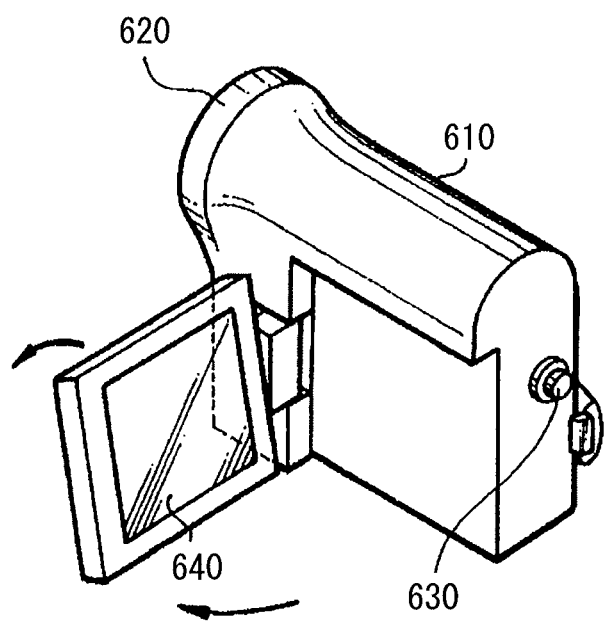
FIG. 19 is a perspective view illustrating an appearance of a fourth application example.

FIG. 19 illustrates an appearance of a video camcorder to which the display units 1 and 2 of the foregoing embodiments are applied. The video camcorder has, for example, a main body 610, a lens for shooting an object 620 provided on the front side surface of the main body 610, a start/stop switch in shooting 630, and a display section 640. The display section 640 is composed of the display unit 1 according to the foregoing embodiment.

Fifth Application Example

FIGS. 20A to 20G illustrate appearances of a mobile phone to which the display units 1 and 2 of the foregoing embodiments are applied. In the mobile phone, for example, an upper package 710 and a lower package 720 are jointed by a joint section (hinge section) 730. The mobile phone has a display 740, a sub-display 750, a picture light 760, and a camera 770. The display 740 or the sub-display 750 is composed of the display unit 1 according to the foregoing embodiment.

While the present technology has been described with reference to the embodiments and the modification, the present technology is not limited to the foregoing embodiments and the like, and various modifications may be made. For example, the material, the thickness, the film-forming method, the film-forming conditions, and the like of each layer are not limited to those described in the foregoing embodiments and the like, and other material, other thickness, other film-forming method, and other film-forming conditions may be adopted.

Further, in the foregoing embodiments and the like, the description has been given of the case in which the white light emitting layer including three layers that are the red light emitting layer 16CR, the green light emitting layer 16CG, and the blue light emitting layer 16CB is formed as the light emitting layer 16C of the organic layer 16. However, the structure of the white light emitting layer 16C is not particularly limited. It is possible to adopt a structure in which two complimentary color light emitting layers such as an orange light emitting layer and a blue light emitting layer and a blue green light emitting layer and a red light emitting layer are layered. In addition, the light emitting layer 16C is applicable not only to a display using a white light emitting layer, but also is applicable to a mono-color display unit in which, for example, only the green light emitting layer 16CG is formed.

Furthermore, for example, in the foregoing embodiments and the like, the description has been given of the case in which the first electrode 14 is an anode and the second electrode 17 is a cathode. However, it is possible that the first electrode 14 is a cathode and the second electrode 17 is an anode to the contrary. In this case, as a material of the second electrode 17, a simple substance or an alloy of gold, silver, platinum, copper, or the like is suitable. However, if the surface of the second electrode 17 is provided with appropriate coating, other material is able to be used. Further, in the case where the first electrode 14 is a cathode and the second electrode 17 is an anode, in the light emitting layer 16C, the red light emitting layer 16CR, the green light emitting layer 16CG, and the blue light emitting layer 16CB are preferably layered sequentially from the second electrode 17 side.

It is possible to achieve at least the following configurations from the above-described example embodiments of the disclosure.

(1) An organic light emitting device including:
  a first electrode and a second electrode;
  an organic layer including a light emitting layer between the first electrode and the second electrode; and
  an insulating film covering a rim of the first electrode from a surface thereof to a side surface thereof, and having an internal wall surface being in contact with the organic layer, and one or more corner sections in the internal wall surface with a ridge line thereof in parallel with the surface of the first electrode.

(2) The organic light emitting device according to (1), wherein the internal wall surface of the insulating film is composed of a plurality of faces bounded by the ridge line, and respective inclined angles of the plurality of faces with respect to the surface of the first electrode are different from each other.

(3) The organic light emitting device according to (1) or (2), wherein respective inclined angles of a plurality of surfaces of the insulating film become larger as positions thereof are shifted from the second electrode side to the first electrode side.

(4) The organic light emitting device according to any one of (1) to (3), wherein an angle made by a face on the first electrode side of the internal wall surface and the surface of the first electrode is equal to or larger than 70 deg and smaller than 90 deg.

(5) The organic light emitting device according to any one of (1) to (4), wherein an angle made by a surface on the second electrode side of the internal wall surface and the surface of the first electrode is from 20 deg to 45 deg both inclusive.

(6) The organic light emitting device according to any one of (1) to (5), wherein the insulating film is composed of silicon oxynitride (SiON).

(7) The organic light emitting device according to any one of (1) to (6), wherein the corner section is formed by providing the insulating film with inverse sputtering process.

(8) An organic light emitting device including:
  a first electrode and a second electrode;
  an organic layer including a light emitting layer between the first electrode and the second electrode; and
  an insulating film covering a side surface of the first electrode, and having an inclined surface from an upper end to a lower end of the side surface.

(9) The organic light emitting device according to (8), wherein the first electrode, the second electrode, and the organic layer are provided over a substrate, and
  an angle made by the substrate and the inclined surface is equal to or smaller than 70 deg.

(10) The organic light emitting device according to (9), wherein the angle made by the substrate and the inclined surface is from 30 deg to 60 deg both inclusive.

(11) The organic light emitting device according to (9) or (10), wherein a planarizing layer is provided between the substrate and the first electrode, and
  the inclined surface is in contact with the planarizing layer.

(12) The organic light emitting device according to any one of (8) to (11), wherein the first electrode, the second electrode, and the organic layer are provided over a substrate, and
  an angle made by the substrate and the side surface of the first electrode is from 80 deg to 90 deg both inclusive.

(13) A display unit including
  a plurality of organic light emitting devices,
  wherein the organic light emitting devices include:
  a first electrode and a second electrode;
  an organic layer including a light emitting layer between the first electrode and the second electrode; and
  an insulating film covering a rim of the first electrode from a surface thereof to a side surface thereof, and having an internal wall surface being in contact with the organic layer, and one or more corner sections in the internal wall surface with a ridge line thereof in parallel with the surface of the first electrode.

(14) A display unit including
  a plurality of organic light emitting devices,
  wherein the organic light emitting devices include:
  a first electrode and a second electrode;
  an organic layer including a light emitting layer between the first electrode and the second electrode; and
  an insulating film covering a side surface of the first electrode, and having an inclined surface from an upper end to a lower end of the side surface.

The present disclosure contains subject matter related to that disclosed in Japanese Priority Patent Application JP 2011-075724 filed in the Japanese Patent Office on Mar. 30, 2011 and Japanese Priority Patent Application JP 2011-281214 filed in the Japanese Patent Office on Dec. 22, 2011, the entire contents of which is hereby incorporated by reference.

It should be understood by those skilled in the art that various modifications, combinations, sub combinations and alternations may occur depending on design requirements and other factors insofar as they are within the scope of the appended claims or the equivalents thereof.

What is claimed is:

1. An organic light emitting device comprising:
   a first electrode and a second electrode;
   an organic layer including a light emitting layer between the first electrode and the second electrode; and
   an insulating film covering a rim of the first electrode from a top surface thereof to a side surface thereof, and having an aperture therein above the first electrode,
   wherein the insulating film has an internal wall surface that is in contact with the organic layer and forms a border of the aperture, the internal wall surface including at least a first face portion and a second face portion, the first face portion extending from the first electrode to the second face portion, the second face portion extending from the first face portion toward a top surface of the insulating film,
   wherein a first angle $\theta1$ between the first face portion and the top surface of the first electrode is larger than a second angle $\theta2$ between the second face portion and a line parallel to the top surface of the first electrode, and
   wherein the second angle $\theta2$ is such that $20° \leq \theta2 \leq 45°$.

2. A display unit comprising
   a plurality of organic light emitting devices,
   wherein the organic light emitting devices include:
   a first electrode and a second electrode;
   an organic layer including a light emitting layer between the first electrode and the second electrode; and
   an insulating film covering a rim of the first electrode from a top surface thereof to a side surface thereof, and having an aperture therein above the first electrode,
   wherein the insulating film has an internal wall surface that is in contact with the organic layer and forms a border of the aperture, the internal wall surface including at least a first face portion and a second face portion, the first face portion extending from the first electrode to the second face portion, the second face portion extending from the first face portion toward a top surface of the insulating film,
   wherein a first angle $\theta1$ between the first face portion and the top surface of the first electrode is larger than a second angle $\theta2$ between the second face portion and a line parallel to the top surface of the first electrode, and
   wherein the second angle $\theta2$ is such that $20° \leq \theta2 \leq 45°$.

3. An organic light emitting device comprising:
   a first electrode and a second electrode;
   an organic layer including a light emitting layer between the first electrode and the second electrode; and
   an insulating film covering a rim of the first electrode from a top surface thereof to a side surface thereof, and having an aperture therein above the first electrode,
   wherein the insulating film has an internal wall surface that is in contact with the organic layer and forms a border of the aperture, the internal wall surface including at least a first face portion and a second face portion, the first face portion extending from the first electrode to the second face portion, the second face portion extending from the first face portion toward a top surface of the insulating film, and an intersection of the first and second face portions forming a ridge line in parallel with the top surface of the first electrode,
   wherein a first angle $\theta1$ between the first face portion and the top surface of the first electrode is such that $70° \leq \theta1 \leq 90°$, and
   wherein a second angle $\theta2$ between the second face portion and a line parallel to the top surface of the first electrode is such that $20° \leq \theta2 \leq 45°$.

4. The display unit of claim 2,
   wherein the organic layer is continued between the apertures of the plurality of organic light emitting devices.

* * * * *